(12) United States Patent
Hoentschel et al.

(10) Patent No.: US 8,338,885 B2
(45) Date of Patent: Dec. 25, 2012

(54) TECHNIQUE FOR ENHANCING DOPANT PROFILE AND CHANNEL CONDUCTIVITY BY MILLISECOND ANNEAL PROCESSES

(75) Inventors: Jan Hoentschel, Dresden (DE); Thomas Feudel, Radebeul (DE); Ralf Illgen, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/401,896

(22) Filed: Feb. 22, 2012

(65) Prior Publication Data
US 2012/0146155 A1 Jun. 14, 2012

Related U.S. Application Data

(62) Division of application No. 12/623,683, filed on Nov. 23, 2009, now Pat. No. 8,143,133.

(30) Foreign Application Priority Data

Nov. 28, 2008 (DE) .......................... 10 2008 059 501

(51) Int. Cl.
*H01L 21/00* (2006.01)
(52) U.S. Cl. ...................................................... 257/327
(58) Field of Classification Search ........... 257/327–344
See application file for complete search history.

(56) References Cited

U.S. PATENT DOCUMENTS

| 6,380,044 B1 | 4/2002 | Talwar et al. ................. 438/308 |
| 8,143,133 B2 * | 3/2012 | Hoentschel et al. .......... 438/307 |
| 2007/0202653 A1 | 8/2007 | Hoentschel et al. .......... 438/301 |
| 2007/0281472 A1 | 12/2007 | Press et al. .................... 438/664 |

OTHER PUBLICATIONS

Translation of Official Communication from German Patent Office for German Patent Application No. 10 2008 059 501.2 dated Sep. 21, 2009.

* cited by examiner

*Primary Examiner* — Richard A. Booth
(74) *Attorney, Agent, or Firm* — Williams, Morgan & Amerson

(57) ABSTRACT

During the fabrication of advanced transistors, significant dopant diffusion may be suppressed by performing a millisecond anneal process after completing the basic transistor configuration, wherein a stress memorization technique may also be obtained by forming a strain-inducing area within a sidewall spacer structure. Due to the corresponding void formation in the spacer structure, a high tensile strain component may be obtained, in the adjacent channel region.

14 Claims, 5 Drawing Sheets

TECHNIQUE FOR ENHANCING DOPANT PROFILE AND CHANNEL CONDUCTIVITY BY MILLISECOND ANNEAL PROCESSES

This application is a divisional of Ser. No. 12/623,683 filed Nov. 23, 2009 now U.S. Pat. No. 8,143,133.

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, requiring sophisticated dopant profiles in combination with a low series resistance.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are and will be based on silicon devices due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, at least at the area in the vicinity of the channel region, i.e., source and drain extension regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth. The introduction of a high dose of dopants into a crystalline substrate area, however, generates heavy damage in the crystal structure, and therefore one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, in addition to the dopant activation and the curing of crystal damage, dopant diffusion may also occur during the annealing, which may lead to a loss of dopant atoms in the extension regions, thereby "blurring" the dopant profile. Thus, on the one hand, a high anneal temperature may be desirable in view of a high degree of dopant and re-crystallization of implantation-induced lattice damage, while, on the other hand, the duration of the anneal process should be short in order to restrict the degree of dopant diffusion, which may reduce the dopant gradient at the respective PN junctions and also reduce the overall conductivity due to reducing the averaged dopant. Furthermore, very high temperatures during the anneal process may negatively affect the gate insulation layer, thereby reducing the reliability thereof. That is, high anneal temperatures may degrade the gate insulation layer and thus may influence the dielectric characteristics thereof, which may result in increased leakage currents reduced breakdown voltage and the like. Therefore, for highly advanced transistors, the positioning, shaping and maintaining of a desired dopant profile are important properties for defining the final performance of the device, since the overall series resistance of the conductive path between the drain and source contacts may represent a dominant part for determining the transistor performance.

Recently, advanced anneal techniques have been developed, in which extremely high temperatures may be achieved at a surface portion of the substrate, thereby providing sufficient energy to the atoms for activating the dopants and re-crystallizing lattice damage, wherein, however, the duration of the treatment is short enough to substantially prevent a significant diffusion of the dopant species and other impurities contained in the carrier material. Respective advanced anneal techniques are typically performed on the basis of radiation sources that are configured to provide light of appropriate wavelength that may be efficiently absorbed in upper portions of the substrate and any components formed thereon, wherein the effective duration of the irradiation may be controlled to a desired small time interval, such as a few milliseconds and significantly less. For instance, respective flash lamp exposure sources are available, which provide light of a defined wavelength range resulting in a surface-near heating of material, thereby providing the conditions for short range motions of the respective atoms in the materials provided near the surface of the carrier material. In other cases, laser radiation may be used, for instance, in the form of short laser pulses or a continuous beam that may be scanned across the substrate surface on the basis of an appropriate scan regime in order to obtain the desired short term heating at each point on the substrate. Thus, contrary to traditional rapid thermal anneal (RTA) processes, in which frequently the entire carrier material may be heated to a desired temperature, the radiation-based advanced anneal techniques create non-equilibrium conditions wherein a high amount of power is supplied within extremely short time intervals, thereby providing the required high temperatures at a very thin surface layer, while the remaining material of the substrate may remain substantially unaffected by the energy deposition during the anneal process. Thus, in advanced manufacturing regimes, traditional RTA processes may frequently be complemented by advanced radiation-based anneal processes in order to obtain a high degree of dopant activation and re-crystallization in drain and source regions while not unduly contributing to dopant diffusion, which may be advantageous in terms of a steep dopant gradient at the respective PN junctions.

The continuous reduction of the transistor dimensions, however, is associated with further issues, for instance in view of controllability of the channel region, since a reduced channel length usually requires increased capacitive coupling of the gate electrode to the channel region. This requirement is typically met by reducing the thickness of the gate dielectric material, which has now led to silicon dioxide based gate dielectrics of 1.5 nm or less. This thickness of the gate dielectric is, however, very critical in view of leakage currents, as these currents may exponentially increase when reducing the thickness of the gate dielectric. Hence, other countermeasures are used, such as sophisticated dopant profiles in the form of counter-doped areas and the like, which may thus also require well-controllable anneal processes. However, some of these measures may be associated with a reduction of channel conductivity. Similarly, the usage of high-k dielectric materials for the gate insulation layers may be associated with a deterioration of the channel conductivity.

It has, therefore, been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In some approaches, external stress created by, for instance, permanent overlaying layers and the like is used in an attempt to create a desired strain within the channel region. Although a promising approach, the process of creating the strain in the channel region by applying a specified external stress may depend on the efficiency of the stress transfer mechanism for the external stress provided, for instance, by contact etch stop layers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs. Moreover, the amount of stress-inducing material and in particular the intrinsic stress thereof may not be arbitrarily increased without requiring significant design alterations.

In still a further approach, a substantially amorphized region may be formed adjacent to the gate electrode at an intermediate manufacturing stage, which may then be re-crystallized in the presence of a rigid layer formed above the transistor area. During the anneal process for re-crystallizing the lattice, the growth of the crystal will occur under stress conditions created by the overlayer and result in a strained crystal. After the re-crystallization, the stress-inducing layer may be partly or completely removed, wherein, nevertheless, a certain amount of strain may be "conserved" in the re-grown lattice portion. This effect is generally known as stress memorization. Although the exact mechanism is not yet fully understood, it is believed that, upon re-crystallization of the substantially amorphized material, the increased volume of the amorphous material compared to the crystalline material may be substantially maintained due to the presence of the rigid surface layer that reduces or prevents the natural volume reduction which would usually occur during the re-crystallization. Hence, the strained re-grown crystalline material may induce a corresponding tensile strain in the region adjacent to the re-crystallized region of increased volume. The tensile strain may thus also be maintained after removal of a portion or all of the rigid surface layer.

Consequently, the finally obtained transistor performance may be significantly determined by the strain conditions in the channel region and the resulting dopant profile, which may both be determined by the process history with respect to the annealing of the semiconductor device. For example, the application of one or more stress memorization approaches during the overall manufacturing flow may result in increased dopant diffusion, thereby affecting the overall dopant profile. The increased dopant diffusion, however, may require increased transistor dimensions in order to accommodate any thermal diffusion of the dopant atoms, which, in addition to a less pronounced dopant gradient at corresponding PN junctions, may generally reduce overall transistor performance and may also negatively impact the finally obtained packing density.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices including sophisticated transistor elements in which enhanced strain conditions may be established within the channel region, at least of one type of transistor, while at the same time overall reduced transistor dimensions and increased performance may be accomplished on the basis of superior dopant profiles. For this purpose, advanced anneal techniques, which may also be referred to herein as millisecond anneal techniques, may be applied after incorporating the required dopant species without any intermediate high temperature processes so that a thermally induced diffusion of the dopants may be efficiently suppressed during the entire manufacturing sequence for forming the drain and source regions. Upon a final millisecond anneal process, nevertheless, enhanced strain conditions may be generated, at least in one type of transistor, by creating a corresponding strain component by means of respective spacer elements, which may result in a significant modification of a structure of a liner material that is positioned between the spacer elements and the semiconductor material of the drain and source regions. It has been recognized that, for instance, in the case of N-channel transistors, a significant tensile strain component may be generated by creating a corresponding strain-inducing area below a corresponding spacer element, which may thus create an efficient tensile strain component in the adjacent channel region. Consequently, in addition to creating superior dopant profiles, thereby allowing the reduction of transistor dimensions, the efficiency of other strain-inducing mechanisms, such as incorporated strained semiconductor alloys and the like, may also be preserved with higher efficiency by avoiding any high temperature processes, while at the same time an additional strain-inducing mechanism may be created by applying the millisecond anneal process as a final high temperature process in the presence of a corresponding spacer structure in this context, a millisecond anneal process is to be understood as an anneal process in which a surface temperature of at least 1000° C. may be applied to any position of the surface for a time interval of approximately 10 milliseconds and less.

One illustrative method disclosed herein comprises performing a process sequence for forming a dopant profile of drain and source regions of a transistor that is formed in a device level of a semiconductor device while avoiding exposure of the transistor to a process temperature above approximately 800° C. The method further comprises annealing the transistor in the presence of a dielectric material that covers at least a portion of the drain and source regions by performing a millisecond anneal process. Finally, the method comprises forming a contact structure above the transistor after annealing the transistor.

A further illustrative method disclosed herein comprises forming drain and source regions of a first transistor device by performing a plurality of implantation processes for incorporating dopant species into the drain and source regions without intermediate dopant activation. Additionally, the method comprises activating the dopant species in the drain and source regions of the first transistor by performing a millisecond anneal process in the presence of a dielectric material covering at least a portion of the drain and source regions.

One illustrative semiconductor device disclosed herein comprises a first transistor comprising drain and source regions formed in a semiconductor region and a channel region positioned in the semiconductor region between the drain region and the source region. Furthermore, the first transistor comprises a gate electrode formed above the channel region and separated therefrom by a gate insulation layer. Furthermore, a sidewall spacer structure is formed on sidewalls of the gate electrode and comprises a spacer element formed above a liner. Moreover, a strain-inducing area is positioned in the liner, wherein the strain-inducing area induces a tensile strain in the channel region.

BRIEF DESCRIPTION OF THE DRAWINGS

The disclosure may be understood by reference to the following description taken in conjunction with the accompanying drawings, in which like reference numerals identify like elements, and in which.

Figure 1A:
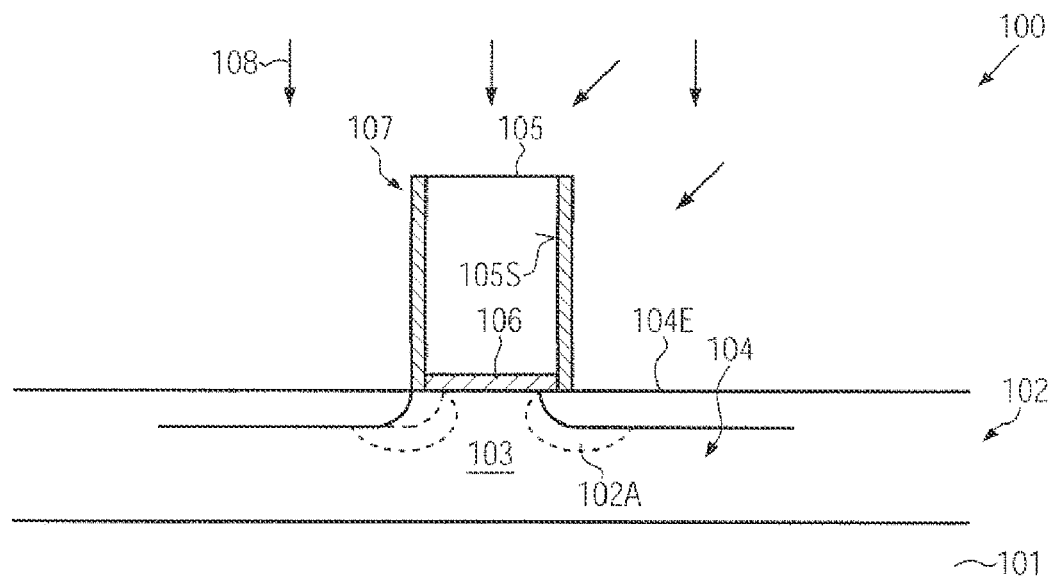
FIGS. 1a-1c schematically illustrate cross-sectional views of a transistor element during various manufacturing stages in forming drain and source dopant profiles without intermediate high temperature processes, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied, by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to sophisticated semiconductor devices in which the dopant profile of transistors may be formed on the basis of high temperature anneal processes in which significant dopant diffusion may be suppressed in order to reduce overall transistor dimensions and provide enhanced dopant gradients at the corresponding PN junctions. At the same time, an efficient strain-inducing mechanism may be provided by appropriately positioning a millisecond anneal process in the overall manufacturing flow, wherein it has been recognized that, although only a short term anneal process may be used, nevertheless, an efficient reconfiguration of material in the vicinity of the channel region may be achieved, which may result in a corresponding strain component in the adjacent channel region. For example, a final millisecond anneal process, after incorporating any required dopant species and avoiding any intermediate high temperature processes, may result in an efficient modification of the internal stress state of sidewall spacers, which may thus be transferred into the channel region, thereby also creating a strain-inducing area in a dielectric material positioned between the spacer element and the drain and source region. In some illustrative embodiments, the strain-inducing area may comprise a void formed in the dielectric liner material of a sidewall spacer structure caused by the high tensile stress component in the overlying spacer element, so that, due to the close proximity of the strain-inducing, area a moderately high strain component may be created in the channel region. Moreover, since high temperature processes may be substantially avoided during the preceding manufacturing sequence, other strain-inducing mechanisms, such as the incorporation of a strain-inducing semiconductor alloy in the drain and source regions and/or the channel region of the transistors, may be maintained with superior efficiency, since a corresponding diffusion of specific components of the semiconductor alloy, such as germanium atoms, carbon atoms and the like, may be significantly reduced, thereby confining the corresponding component to a desired area. Hence, upon re-crystallizing implantation-induced damage during the millisecond anneal process, a highly located strained state may be re-established which may finally result in an increased overall strain component in the adjacent channel region.

In some illustrative embodiments disclosed herein, the principles disclosed herein, which may also be referred to as a new type of stress memorization technique, may be applied to specific transistor elements only if the corresponding strain-inducing effect may considered inappropriate for other transistors. For this purpose, the spacer structure may be reduced in width and/or one or more spacer elements may be substantially completely removed prior to a millisecond anneal process, thereby significantly reducing any strain-inducing effect in the corresponding transistor element. At the same time, the spacer structure of reduced width may contribute to increased transistor performance upon applying a stress-inducing material after completing the basic transistor configuration. In this case, a stress-inducing dielectric material, such as a contact etch stop layer, may be positioned more closely to the channel region, due to the reduced spacer width or due to a missing spacer element.

Consequently, the superior transistor characteristics obtained by substantially avoiding any diffusion of dopant atoms may be combined with a new type of stress memorization technique, thereby contributing increased packing density and overall enhanced performance of complex semiconductor devices including corresponding transistor elements.

FIG. 1a schematically illustrates a cross-sectional view of a transistor device 100 in an early manufacturing stage. The transistor 100 may represent, in one illustrative embodiment, no N-channel transistor, the performance of which may be enhanced by inducing a tensile strain component, as is also previously explained. The transistor 100 may comprise a substrate 101, which may represent any appropriate carrier material for forming thereon or thereabove an appropriate semiconductor layer 102, in and above which respective circuit components, such as the transistor 100, are formed. The substrate 101 may represent a bulk semiconductor substrate, such as a silicon substrate, a silicon/germanium substrate or any other appropriate semiconductor material. In other cases, the substrate 101 may represent an insulating material or may have formed thereon a dielectric layer which may represent a barrier between the substrate 101 and the semiconductor layer 102. For example, the substrate 101, in combination with the semiconductor layer 102, may represent a silicon-on-insulator (SOI) configuration when a buried insulating layer (not shown) or a fully insulating material is provided below the semiconductor layer 102. In illustrative embodiments, the semiconductor layer 102 may represent a silicon-based material, the electronic behavior of which may be appropriately adapted on the basis of a corresponding strain component as previously explained. The transistor 100 may further comprise a gate electrode 105, which may be comprised of polysilicon or any other appropriate electrode material as required. The gate electrode 105 is formed above the semiconductor layer 102 and substantially defines a channel region 103, which may be located below the gate electrode 105 and separated there-from by a gate insulation layer 106. The gate electrode 105 may comprise sidewalk 105S, on which may be formed a spacer structure 107 that may comprise, in the manufacturing stage shown, an offset spacer material, such as a silicon dioxide material, depending on the overall process strategy. It should be appreciated that a material composition and a thickness of the spacer structure 107 in the manufacturing stage shown in FIG. 1a may be adapted to the requirements for the further processing, i.e., for the incorporation of an appropriate dopant species in order to create the desired dopant concentration and profile in drain and source areas 104 of the semiconductor layer 102. In the manufacturing stage shown, a dopant species may be incorporated into the drain and source areas 104 in order to define corresponding extension regions 104E, which may be understood as doped areas wherein the dopant concentration may extend down to a specified depth, which may be in the range of several nanometers to several tenths of nanometers, depending on the overall configuration of the transistor 100. For example, the extension region 104E may comprise a moderately high concentration of an N-type dopant species if the transistor 100 represents an N-channel transistor.

The transistor 100 as illustrated in FIG. 1a may be formed on the basis of the following processes. After providing the substrate 101 having formed thereabove the semiconductor layer 102, isolation structures (not shown), such as shallow trench isolations and the like, may be formed so as to define appropriately sized active areas in which one or more circuit components, such as the transistor 100, may be formed. For this purpose, sophisticated lithography, etch, deposition and planarization techniques may be applied. Next, the basic doping profile in the corresponding active regions may be defined on the basis of well-established ion implantation processes, wherein respective resist masks may be used to prevent the incorporation of unwanted dopant species into certain device areas. Thereafter, appropriate materials for the gate electrode 105 and the gate insulation layer 106 may be formed, for instance by oxidation and/or deposition for the gate insulation layer 106 and by deposition of the material of the gate electrode 105, followed by advanced lithography and etch techniques in order to appropriately define the lateral dimensions of the gate electrode 105. For sophisticated applications, a gate length, i.e., in FIG. 1a, the horizontal extension of the gate electrode 105, may be 50 nm and less. Thereafter, in some illustrative embodiments, strain-inducing semiconductor materials may be incorporated into the drain and source areas 104, as will be described later on in more detail when referring to FIGS. 2a-2d. Next, the spacer structure 107 may be provided, for instance by deposition and the like, wherein a thickness of the spacer structure 107, in the manufacturing stage shown, may be adapted to an implantation sequence 108 that is performed to define the dopant profile and concentration in the vicinity of the channel region 103. For instance, an appropriate dopant species for the extension regions 104E may be incorporated by appropriately selected ion implantation parameters, while any counter doped areas 102A may also be formed in order to adjust the overall transistor characteristics. As previously explained, enhanced channel controllability may be accomplished by appropriately adapting the dopant concentration in an area near the channel region 103. For this purpose, any appropriate implantation depth may be used, for instance by applying one or more appropriate tilt angles in order to position the desired dopant species below the gate electrode 105. It should be appreciated that a tilt angle is to be understood as the angle defined by the direction of incidence of a corresponding ion beam with respect to the surface normal of the layer 102. That is, a non-tilted implantation is to be understood as a process in which the incident ion beam substantially perpendicularly impinges on the semiconductor layer 102. It should also be appreciated that asymmetric dopant profiles may be generated, if required, as is, for instance, illustrated in FIG. 1a. For example, the overlap of the extension region 104E at one side, for instance at a source side, may be greater compared to a corresponding overlap at a drain side of the transistor 100. In other cases, the extension regions 104E may be selected to be substantially symmetric while the position and/or size of the counter doped areas 102A may be selected to be asymmetric with respect to drain and source regions of the transistor 100. It should further be appreciated that the implantation sequence 108 may also include other implantation processes, for instance for creating crystalline damage for enhancing uniformity of any further implantation steps, which is typically referred to as pre-amorphization implantation. For this purpose, any appropriate implantation species, such as xenon and the like, may be introduced in order to create the desired crystalline damage. Thereafter, the further processing may be continued, however, without performing any high temperature treatments, which are to be understood as treatments in which at least the semiconductor layer 102 may be exposed to a temperature of approximately 800° C. and higher. In some illustrative embodiments, the transistor 100 may be processed without experiencing a temperature of approximately 600° C. and higher.

Figure 1B:
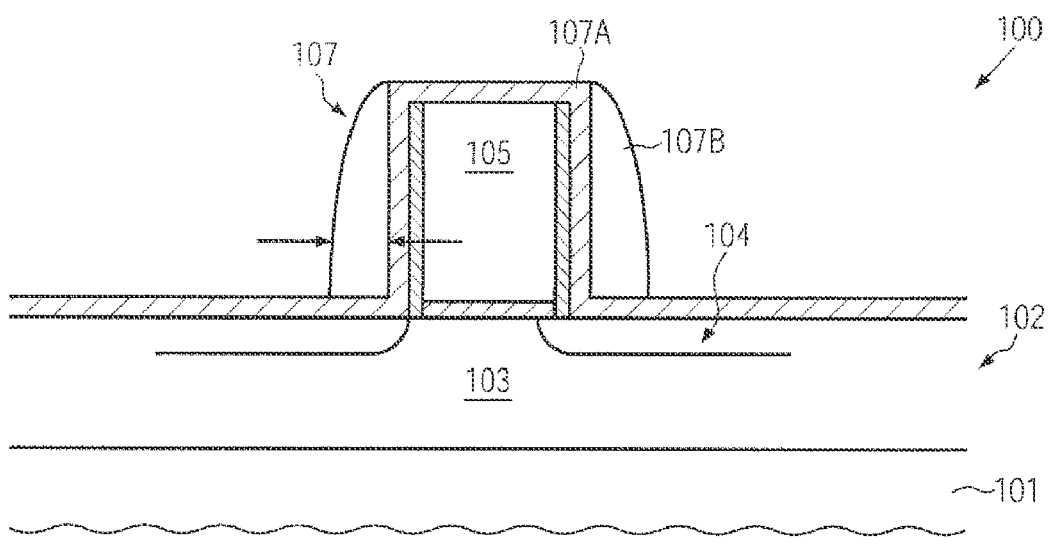

FIG. 1b schematically illustrates the device 100 in a further advanced manufacturing stage. As illustrated, the spacer structure 107 now includes one or more additional spacer elements 107B in combination with a corresponding etch stop liner 107A. For example, the etch stop liner 107A may be comprised of silicon dioxide, while the spacer element 107B may be comprised of a silicon nitride material. The spacer structure 107 may be formed with a width that is selected so as to obtain a desired lateral and vertical dopant profile in the drain and source areas 104. As previously discussed, the width of the spacer structure 107 may determine the overall size of the transistor 100, since, typically, the dopant profile in the drain and source areas 104 may have to be adjusted by taking into consideration the thermally induced diffusion of the dopant species during the corresponding anneal processes. In the embodiment shown, any high temperature processes may be substantially suppressed, thereby providing a substantially "diffusionless" configuration of the dopant concentration in the drain and source areas 104. Consequently, a corresponding spacer width may be selected, that is compatible for reduced design dimensions of the transistor 100, since a pronounced thermally induced diffusion, and thus lowering of the corresponding dopant profile, may be suppressed.

The spacer structure 107 as shown in FIG. 1b, i.e., the spacer element 107B and the etch stop liner 107A, may be formed on the basis of well-established process techniques, including the deposition of the liner material followed by the deposition of the spacer material that may be subsequently patterned by well-established anisotropic etch techniques, thereby using the liner 107A as an efficient etch stop material.

Figure 1C:
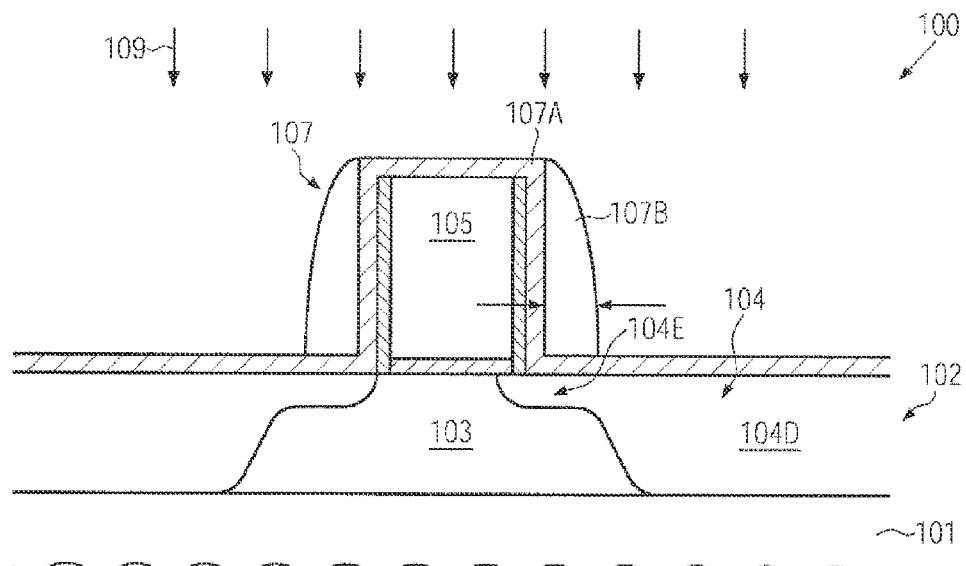

FIG. 1c schematically illustrates the transistor 100 in a further advanced manufacturing stage in which a further implantation process 109 may be performed to introduce the dopant species with a desired concentration and energy for adjusting the lateral and also vertical profile of the drain and source areas 104. For example, in the embodiment shown, deep drain and source regions 104D may be formed during the implantation process 109 so as to extend down to a specified depth. In other cases, the implantation process 109 may be performed so as to establish an "intermediate" dopant concentration, wherein a further implantation process may be performed in a later manufacturing stage on the basis of a further spacer element (not shown), when more sophisticated lateral and vertical dopant profiles are required. In the case shown in FIG. 1c, it may be assumed that the implantation process 109 may be the last implantation process, completing the drain and source areas 104D of the device 100. It should be appreciated, however, that other transistor types may still require one or more further implantation processes in order to incorporate the required dopant species.

Figure 1D:
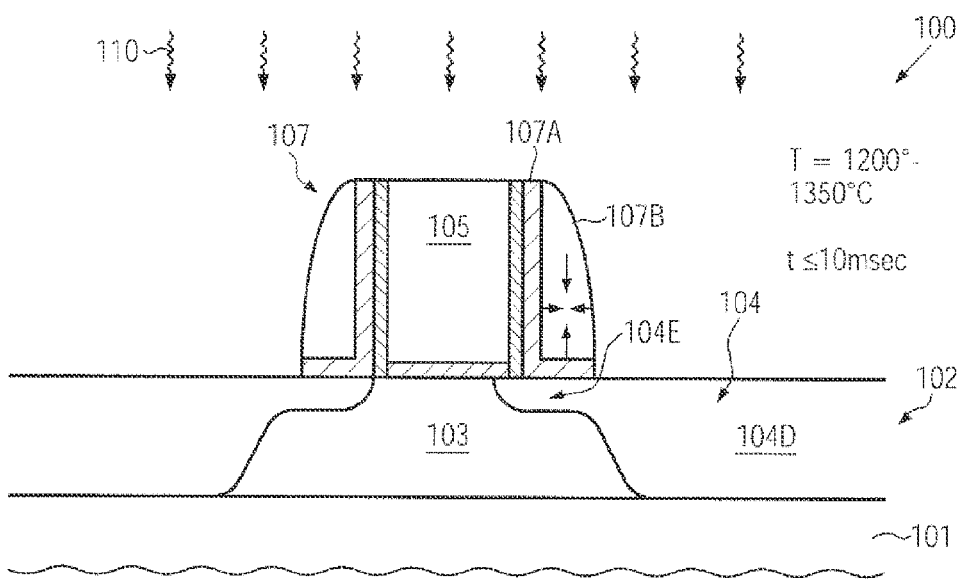
FIG. 1d schematically illustrates a cross-sectional view of the transistor during an anneal process at elevated temperatures for dopant activation and for creating a strain-inducing area below a spacer structure, according to illustrative embodiments.

FIG. 1d schematically illustrates the transistor device 100 when exposed to an anneal process 110 that is designed an as to substantially suppress any significant thermally driven diffusion of dopant species in the drain and source areas 104. A corresponding anneal process may be referred to as a millisecond anneal process in which an exposure time, i.e., an active heating of a specific area of the semiconductor layer 102, may be restricted to approximately 10 milliseconds and less. It should be appreciated that the active heating of the semiconductor layer 102 may be accomplished by restricting the time interval of a corresponding energy deposition, for instance by providing short exposure pulses of an appropriate radiation source, such as a flashlight source, a laser source and the like, wherein, in the restricted time interval, a significant portion of the semiconductor layer 102 may be simultaneously exposed, while, in other cases, an appropriate scan regime may be used to move a radiation spot of restricted size across the semiconductor layer 102 so that active exposure of each position in the layer 102 may also be restricted to the above-specified time interval. Thus, the millisecond anneal process 110 may be performed on the basis of various laser-based or flashlight-based anneal systems. For example, in a laser-based anneal system, an appropriate laser source may provide a continuous or pulsed laser beam which may be directed onto a specific device portion by means of an appropriate beam shaping system. That is, depending on the output power of the laser source, the respective beam shaping system may provide a desired specific beam shape and thus size of a corresponding device portion and the energy density supplied thereto. Typically, an appropriate scan system may be provided for generating a respective relative movement between the corresponding radiation beam and the substrate 101, wherein the scan speed may be selected such that a desired total exposure time in the above-specified range is accomplished during the process 110. As previously explained, dopant diffusion may be efficiently suppressed or maintained at a very low level during the anneal process 110, while at the same time the local temperature in the area near the surface of the substrate 101 may depend on the energy density, which is selected so as to obtain a temperature in the range of approximately 1200-1350° C., according to some illustrative embodiments. In other cases, a different temperature range may be used if considered appropriate for obtaining the desired degree of dopant activation. During the anneal process 110, radiation may, at least partially, be absorbed and may therefore result in a corresponding energy, that is, kinetic energy, for the atoms in the drain and source regions 104 and the extension region 104E and any other areas that may have been damaged during the preceding processing. The kinetic energy transferred to the atoms may initiate a short range movement for reconfiguring the crystalline lattice, thereby also incorporating respective dopant atoms in corresponding lattice sites, thereby resulting in a high degree of dopant activation in the drain and source regions 104. At the same time, any long range atom movements may be substantially suppressed due to the short time period for which the elevated temperatures are created in the semiconductor layer 102. Furthermore, it has been recognized that, during the millisecond anneal process 110, a significant modification of the material in the spacer structure 107 may occur. That is, the spacer element 107B may create a tensile stressed state, which may thus influence the surrounding materials, such as the liner 107A. Consequently, during the dopant activation and the corresponding re-crystallization, a strained state may be generated in the semiconductor layer 102 below the spacer structure 107 wherein the additional tensile stress component created therein during the process 110 may also contribute to the efficient generation of a strained component in the channel region 103.

Figure 1E:
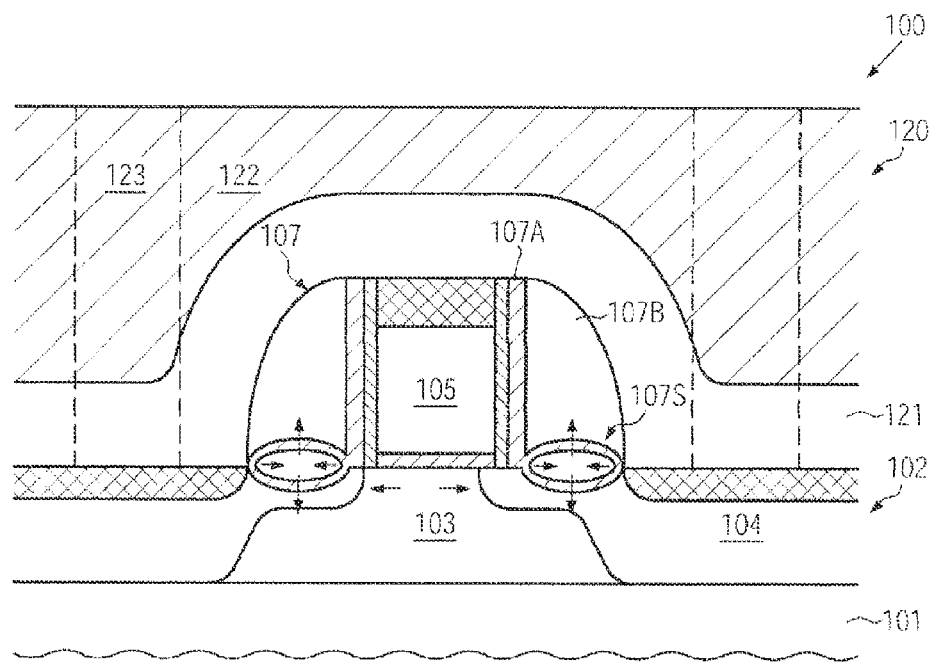
FIG. 1e schematically illustrates a cross-sectional view of the transistor in a further advanced manufacturing stage, according to illustrative embodiments.

FIG. 1e schematically illustrates the transistor device 100 in a further advanced manufacturing stage. As illustrated, the previously performed millisecond anneal process may result in the creation of a strain-inducing area 107S, which may be substantially positioned below the spacer element 107B. For example, as illustrated in FIG. 1e, the strain-inducing area 107S may comprise a void formed in a portion of the liner 107A positioned between the drain and source region 104 and the spacer element 107B. Typically, the liner 107A may initially be under compressive stress, which may result, in combination with the tensile stress component induced during the previously performed millisecond anneal process, in the creation of the area 107S, thereby obtaining a desired tensile strain component in the channel region 103. Consequently, the lattice structure may be substantially re-established in the drain and source areas 104 and in areas adjacent to the channel region 103, however, in a moderately highly strained state caused by the strain-inducing mechanism provided by the spacer 107B via the area 107S, which may be considered as an area for preserving a certain type of strain. Hence, a corresponding technique for forming the strain-inducing area 107S may also be referred to as a stress memorization technique. On the other hand, since any high temperature processes may have been avoided prior to performing the millisecond anneal process (FIG. 1d), the dopant profile of the drain and source regions 104, including any counter doped areas and the like, may be substantially preserved, thereby also providing overall enhanced transistor performance.

Furthermore, as illustrated in FIG. 1e, the transistor 100 may comprise a contact structure 120, i.e., a dielectric material in which corresponding contacts 123 are to be formed in a later manufacturing stage. The contact structure 120 may comprise a first dielectric material 121, which may also be referred to as etch stop material, in combination with an interlayer dielectric material 122, such as silicon dioxide and the like. In some illustrative embodiments, the first dielectric material 121 or etch stop material, which may be provided in the form of silicon nitride, nitrogen-containing silicon carbide, a diamond-like carbon material and the like, may be provided so as to exhibit a high internal stress component, which may also act on the channel region 103 in order to further enhance overall performance thereof. The contact structure 120 may be formed on the basis of well-established process techniques, for instance including the deposition of the layer 121 by plasma-enhanced techniques, wherein process parameters may be selected such that a desired internal stress level may be created. Thereafter, the material 122 may be deposited and planarized, followed by sophisticated lithography techniques for forming respective contact openings, which may finally be filled with an appropriate metal-containing material, such as tungsten and the like.

With reference to FIGS. 2a-2d, further illustrative embodiments will now be described in which additional strain-inducing mechanisms may be implemented, while a selective application of the stress memorization technique as described above may also be used, if appropriate.

Figure 2A:
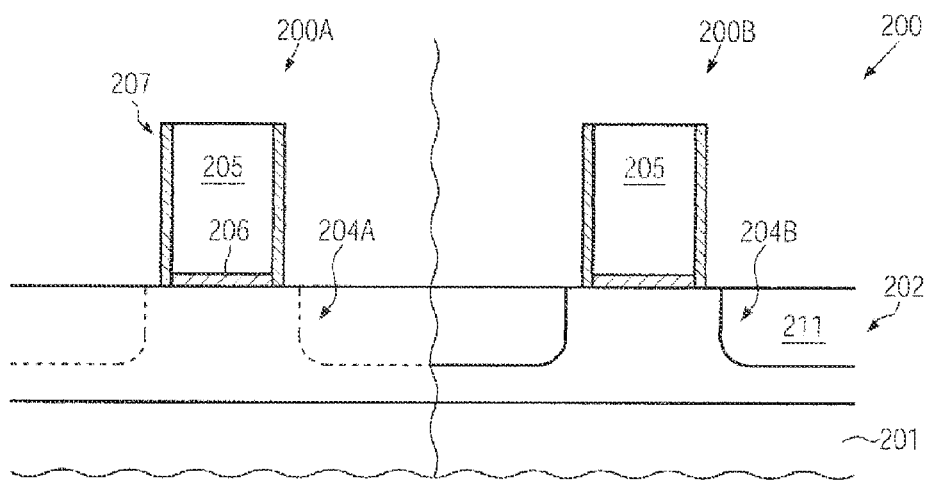
FIGS. 2a-2d schematically illustrate cross-sectional views of a semiconductor device including transistors of different conductivity type, at least one of which may receive a strain-inducing area positioned below a spacer structure, according to further illustrative embodiments.

FIG. 2a schematically illustrates a semiconductor device 200 comprising a first transistor 200A and a second transistor 200B in an early manufacturing stage. The semiconductor device 200 may comprise a substrate 201 and a semiconductor layer 202 formed thereabove, which may have a similar configuration as previously described with reference to the device 100. Furthermore, in the manufacturing stage shown, the transistors 200A, 200B may comprise a gate electrode 205 in combination with a gate insulation layer 206, while a spacer structure 207 in an initial stage may also be provided on sidewalls of the gate electrodes 205. Moreover, at least one of the transistors 200A, 200H may comprise a strain-inducing semiconductor material in drain and source areas. For example, in the embodiment shown, the transistor 200B may comprise a semiconductor alloy 211 formed in the drain and source regions 204B. For instance, the semiconductor alloy 211 may represent a silicon/germanium alloy, a silicon/germanium/tin alloy, a silicon/tin alloy and the like, if the base material 202 may be provided as a silicon-based material so that a corresponding mismatch between the natural lattice constants of the base material 202 and the semiconductor alloy 211 may result in a corresponding strained state. For example, for the above-specified materials, a moderately high compressive strain component may be created by the semiconductor alloy 211. Alternatively or additionally to the semiconductor alloy 211, the transistor 200A may also have incorporated in the corresponding drain and source area 204A a desired semiconductor alloy, such as a silicon/carbon material and the like. For instance, the transistor 200A may represent an N-channel transistor so that a corresponding lattice mismatch of a silicon/carbon material may result in a tensile strain component.

The semiconductor device 200 may be formed on the basis of well-established process techniques for forming the gate electrodes 205 and the gate insulation layers 206. Thereafter, depending on the process strategy, at least the transistor 200B may receive corresponding cavities adjacent to the gate electrode 205, which may be subsequently filled with the semiconductor alloy 211 on the basis of well-established selective epitaxial growth techniques. Similarly, if a corresponding semiconductor alloy is to be formed in the transistor 200A, respective cavities may be formed therein and may be filled by a dedicated selective epitaxial growth process. For this purpose, established masking regimes may be available and may be used for forming the corresponding cavities and filling the same with an appropriate semiconductor alloy. Thereafter, the spacer structure 207 may be formed, as is also previously explained with reference to the device 100.

Figure 2B:
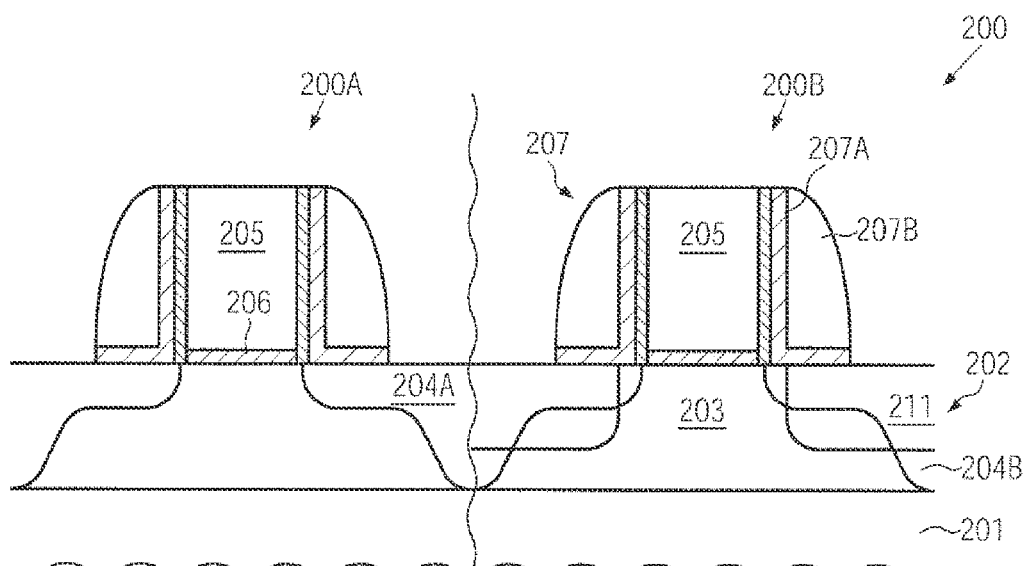

FIG. 2b schematically illustrates the device 200 in a further advanced manufacturing stage in which the spacer structure may include one or more spacer elements 207B in combination with a corresponding liner material 207A. Furthermore, drain and source regions 204A, 204B may be formed in the transistors 200A, 200B, respectively, wherein the corresponding profiles and concentrations may be established on the basis of appropriate implantation techniques, as previously described. For example, a P-type dopant species may be incorporated into the drain and source regions 204B, while an N-type dopant species may be incorporated in the drain and source regions 204A. Furthermore, in some illustrative embodiments, the device 200 may not be exposed to elevated temperatures, such as temperatures of approximately 800° C. and higher, while in still other illustrative embodiments even a temperature of approximately 600° C. may not have been exceeded during the previous manufacturing processes. Consequently, pronounced dopant profiles may be obtained in the drain and source regions 204A, 204B while undue diffusion of components of the semiconductor alloy 211 may also be efficiently suppressed.

Figure 2C:
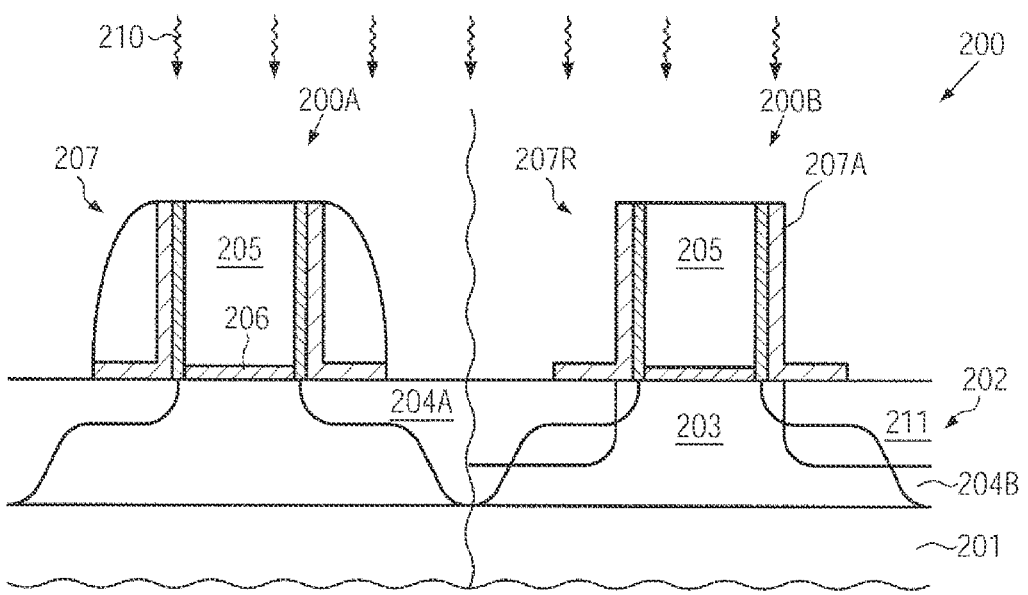

FIG. 2c schematically illustrates the semiconductor device 200 in a further advanced manufacturing stage. As illustrated, the spacer structure of the transistor 200B may be modified, as indicated by 207R, wherein the spacer structure may be reduced in width and/or height in order to reduce the strain-inducing effect during a millisecond anneal process 210. In the embodiment shown, the spacer element 207B (FIG. 2b) may be substantially removed prior to the process 210. For this purpose, well-established manufacturing techniques may be used, for instance the transistor 200A may be masked by a resist mask and the device 200 may be exposed to an appropriate etch ambient for removing material of the spacer element 207B selectively to the liner 207A and the semiconductor alloy 211. For example, hot phosphoric acid may be used according to well-established etch recipes. Thereafter, any resist mask may be removed and the device 200 may be exposed to the elevated temperatures created by the anneal process 210. Consequently, a corresponding modification of the spacer structure 207 in the transistor 200A may create a desired strain component, while a corresponding effect in the transistor 200B may be significantly less.

Figure 2D:
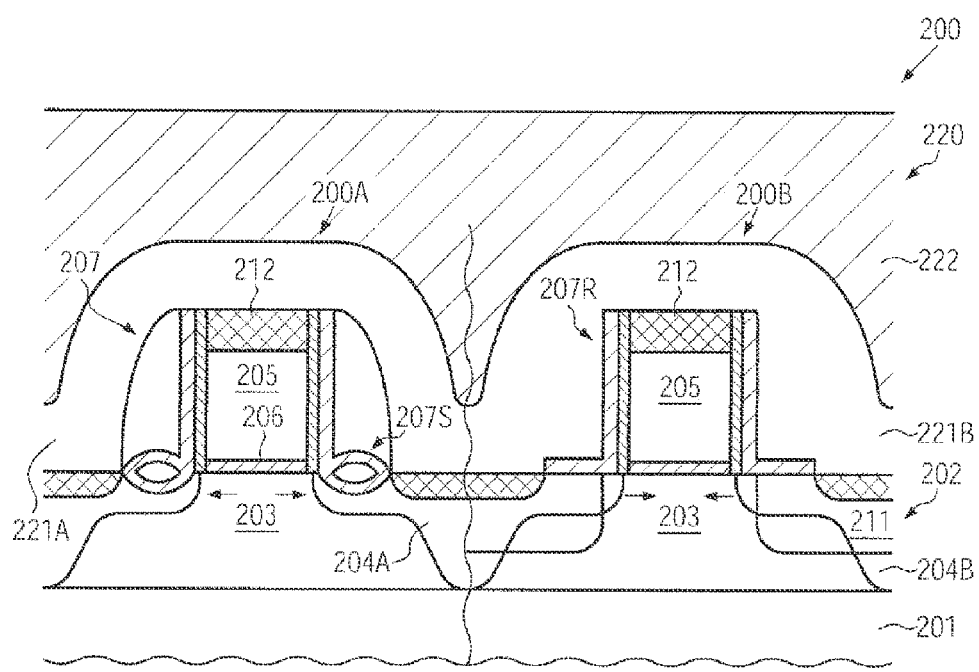

FIG. 2d schematically illustrates the semiconductor device 200 in a further advanced manufacturing stage. As shown, the transistor 200A may comprise a strain-inducing area 207S formed within the spacer structure 207, as is also previously explained with reference to the strain-inducing area 107S of the device 100 (FIG. 1c). Consequently, the corresponding tensile strain component may be generated by the spacer structure 207 including the strain-inducing area 207S, as previously explained. On the other hand, the transistor 200B may have incorporated therein the semiconductor alloy 211, which may provide a desired strain component in the adjacent channel region 203, for instance in the form of a compressive strain component. Moreover, in the manufacturing stage shown, a contact structure 220 may be provided above the transistors 220A, 220B, wherein the contact structure 220 may include a dielectric material 221A formed above the transistor 200A that may have an internal stress level so as to further enhance the strain component in the channel region 203 of the transistor 200A. Similarly, a dielectric material 221B may be formed above the transistor 200B and may have an internal stress level so as to further enhance the strain component in the channel region 203 of the transistor 200B. Moreover, due to the reduced spacer structure 207R, the strain-inducing material of the layer 221B may be positioned close to the channel region 203, thereby enhancing the overall strain-inducing efficiency. Furthermore, the contact structure 220 may further comprise an interlayer dielectric material 222, such as a silicon dioxide material and the like. Furthermore, as illustrated, if required, the transistors 200A, 200B may include metal silicide regions 212 in the drain and source areas 204A, 204B and the gate electrodes 205.

The semiconductor device 200 as shown in FIG. 2d may be formed on the basis of the following processes. The metal silicide regions 212 may be formed in accordance with well-established silicidation techniques, followed by the deposition of one of the materials 221A, 221B, wherein corresponding deposition parameters are appropriately selected such that a high desired internal stress level may be obtained. For example, silicon nitride material may be deposited on the basis of plasma enhanced chemical vapor deposition (CVD) techniques with a high tensile or compressive stress level. Thereafter, an unwanted portion of the previously deposited stressed dielectric material may be removed by using well-established patterning regimes, and the other one of the layers 221A, 221B may be deposited so as to exhibit the desired high internal stress level. Thereafter, an unwanted portion thereof may be removed and the interlayer dielectric material 222 may be deposited and planarized so as to prepare the surface for the patterning of respective contact openings not shown).

As a result, the present disclosure provides semiconductor devices and manufacturing techniques in which superior dopant profiles in drain and source regions may be obtained by suppressing thermally induced diffusion, wherein additional stress memorization effects may also be obtained by performing a millisecond anneal process after completing the basic transistor configuration. It has been recognized that a corresponding millisecond anneal process may result in an efficient strain-inducing mechanism by creating a void-like area during the creation of a tensile stress component in the spacer structure of the transistor upon activating and re-crystallizing the drain and source areas during the short anneal process. In other illustrative embodiments, the corresponding memorization technique may be selectively applied to certain transistors, such as N-channel transistors, while at the same time reducing strain-inducing efficiency for the other type of transistor due to a reduction of the spacer structure, for instance by removing a corresponding spacer element prior to performing the short millisecond anneal process. Consequently, the overall transistor dimensions may be reduced, thereby resulting in increased packing density, while transistor speed may also be enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:
1. A semiconductor device, comprising:
a first transistor comprising:
    drain and source regions formed in a semiconductor region;
    a channel region positioned in said semiconductor region between said drain region and said source region;
    a gate electrode formed above said channel region and separated therefrom by a gate insulation layer;
    a sidewall spacer structure formed on sidewalls of said gate electrode, said sidewall spacer structure comprising a spacer element formed above a liner; and
    at least one strain-inducing void positioned in said liner, said at least one strain-inducing void inducing a tensile strain in said channel region.

2. The semiconductor device of claim 1, wherein said at least one strain-inducing void comprises at least one strain-inducing void formed in said liner by tensile stress in the spacer element.

3. The semiconductor device of claim 1, further comprising a second transistor that comprises a second gate electrode, a second channel region and second drain and source regions containing a strain-inducing semiconductor alloy.

4. The semiconductor device of claim 3, wherein said strain-inducing alloy induces a compressive strain in said second channel region of said second transistor.

5. The semiconductor device of claim 4, further comprising an etch stop layer formed above said first and second transistors and an interlayer dielectric material formed on said etch stop layer, wherein a lateral distance of said etch stop layer from said second gate electrode is less than a lateral distance of said etch stop layer from said gate electrode.

6. The semiconductor device of claim 5, wherein said first transistor is an N-channel transistor and said second transistor is a P-channel transistor.

7. The semiconductor device of claim 1, further comprising a strain-inducing semiconductor alloy formed in said drain and source regions.

8. A semiconductor device, comprising:
   a first transistor comprising:
      drain and source regions formed in a semiconductor region;
      a channel region positioned in said semiconductor region between said drain region and said source region;
      a first gate electrode formed above said channel region and separated therefrom by a gate insulation layer;
      a dielectric material covering at least a portion of said drain and source regions; and
      at least one strain-inducing void positioned in said dielectric material, said at least one strain-inducing void inducing a tensile strain in said channel region.

9. The semiconductor device of claim 8, wherein said at least one strain-inducing void comprises at least one strain-inducing void formed in said dielectric material by tensile stress in a spacer element formed over the dielectric material.

10. The semiconductor device of claim 8, further comprising a second transistor that comprises a second gate electrode, a second channel region and second drain and source regions containing a strain-inducing semiconductor alloy.

11. The semiconductor device of claim 10, wherein said strain-inducing alloy induces a compressive strain in said second channel region of said second transistor.

12. The semiconductor device of claim 11, further comprising an etch stop layer formed above said first and second transistors and an interlayer dielectric material formed on said etch stop layer, wherein a lateral distance of said etch stop layer from said second gate electrode is less than a lateral distance of said etch stop layer from said first gate electrode.

13. The semiconductor device of claim 12, wherein said first transistor is an N-channel transistor and said second transistor is a P-channel transistor.

14. The semiconductor device of claim 8, further comprising a strain-inducing semiconductor alloy formed in said drain and source regions.

* * * * *